US011221991B2

(12) United States Patent
Bassov et al.

(10) Patent No.: US 11,221,991 B2
(45) Date of Patent: Jan. 11, 2022

(54) TECHNIQUES FOR SELECTIVELY ACTIVATING AND DEACTIVATING ENTROPY COMPUTATION

(71) Applicant: EMC IP Holding Company LLC, Hopkinton, MA (US)

(72) Inventors: Ivan Bassov, Brookline, MA (US); Philippe Armangau, Acton, MA (US); Sorin Faibish, Newton, MA (US); Istvan Gonczi, Berkley, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 490 days.

(21) Appl. No.: 16/174,791

(22) Filed: Oct. 30, 2018

(65) Prior Publication Data

US 2020/0134047 A1    Apr. 30, 2020

(51) Int. Cl.

| G06F 7/00 | (2006.01) |
|---|---|
| G06F 17/00 | (2019.01) |
| G06F 16/174 | (2019.01) |
| H03M 7/40 | (2006.01) |
| G06F 3/06 | (2006.01) |

(52) U.S. Cl.
CPC .......... *G06F 16/1744* (2019.01); *G06F 3/061* (2013.01); *G06F 16/1752* (2019.01); *H03M 7/4037* (2013.01)

(58) Field of Classification Search
CPC .................... G06F 16/1744; G06F 16/1752
USPC ........................................................ 707/693
See application file for complete search history.

(56) References Cited

U.S. PATENT DOCUMENTS

| 8,447,948 | B1* | 5/2013 | Erdogan | G06F 12/0871 |
|---|---|---|---|---|
| | | | | 711/173 |
| 9,521,218 | B1* | 12/2016 | Fan | H03M 7/40 |
| 9,559,889 | B1* | 1/2017 | Vincent | H04L 67/2842 |
| 9,626,249 | B1* | 4/2017 | Bushman | H03M 7/30 |
| 2005/0044158 | A1* | 2/2005 | Malik | H04L 51/066 |
| | | | | 709/206 |

(Continued)

OTHER PUBLICATIONS

Kedamath J. Balakrishnan, et al., "Relationship Between Entropy and Test Data Compression," IEEE Transactions on Computer-Aided Design of Integrated Circuits and Systems, vol. 26, No. 2, Feb. 2007.

(Continued)

*Primary Examiner* — Binh V Ho
(74) *Attorney, Agent, or Firm* — Muirhead and Saturnelli, LLC

(57) ABSTRACT

Techniques for data processing may include: receiving a data chunk of the data set; determining, in accordance with criteria including a compressibility ratio for the data set and a cost ratio of compression computation cost and entropy computation cost, whether to activate or deactivate entropy computation for the data set, wherein the compressibility ratio is ratio of a number of compressible data chunks of the data set and a number of uncompressible data chunks of the data set; and responsive to determining to activate entropy computation for the data set, performing first processing comprising: determining an entropy value for the data chunk; and determining, in accordance with the entropy value for the data chunk, whether to compress the data chunk.

18 Claims, 8 Drawing Sheets

(56) References Cited

U.S. PATENT DOCUMENTS

| | | | |
|---|---|---|---|
| 2008/0025298 A1* | 1/2008 | Lev-Ran | H04L 69/04 |
| | | | 370/389 |
| 2014/0195498 A1* | 7/2014 | Asher | H03M 7/607 |
| | | | 707/693 |
| 2014/0244604 A1* | 8/2014 | Oltean | H03M 7/30 |
| | | | 707/693 |
| 2015/0304441 A1* | 10/2015 | Ichien | H04L 67/2828 |
| | | | 709/247 |
| 2016/0306561 A1* | 10/2016 | Huang | G06F 3/0688 |
| 2017/0199684 A1* | 7/2017 | Alavi | G06F 12/0246 |
| 2018/0167481 A1* | 6/2018 | Bhaskar | H03M 7/00 |
| 2018/0213247 A1* | 7/2018 | Huang | H04N 19/11 |
| 2018/0246649 A1* | 8/2018 | Datar | G06F 3/068 |

OTHER PUBLICATIONS

"Entropy (information theory)," Wikipedia, https://en.wikipedia.org/wiki/Entropy_(information_theory), Sep. 9, 2018.

Computer Forensics, Malware Analysis & Digital Investigations: File Entropy, "File Entropy explained," http://wwwforensickb.com/2013/03/file-entropy-explained.html, Mar. 20, 2013.

Werner Ebeling, et al., "Entropy and Compressibility of Symbol Sequences," PhysComp96, Feb. 23, 1997.

* cited by examiner

TECHNIQUES FOR SELECTIVELY ACTIVATING AND DEACTIVATING ENTROPY COMPUTATION

BACKGROUND

Technical Field

This application generally relates to performing data compression operations.

Description of Related Art

Systems may include different resources used by one or more host processors. Resources and host processors in the system may be interconnected by one or more communication connections, such as network connections. These resources may include, for example, data storage devices such as those included in the data storage systems manufactured by Dell Inc. These data storage systems may be coupled to one or more host processors and provide storage services to each host processor. Multiple data storage systems from one or more different vendors may be connected and may provide common data storage for one or more host processors in a computer system.

A host may perform a variety of data processing tasks and operations using the data storage system. For example, a host may issue I/O operations, such as data read and write operations, received at a data storage system. Host systems may store and retrieve data by issuing the I/O operations to the data storage system containing a plurality of host interface units, disk drives (or more generally storage devices), and disk interface units. The host systems access the storage devices through a plurality of channels provided therewith. Host systems provide data and access control information through the channels to a storage device of the data storage system and data of the storage device is also provided from the data storage system to the host systems also through the channels. The host systems do not address the disk drives of the data storage system directly, but rather, access what appears to the host systems as a plurality of files, objects, logical units, logical devices or logical volumes. Thus, the I/O operations issued by the host may be directed to a particular storage entity, such as a file or logical device. The logical devices may or may not correspond to the actual physical drives. Allowing multiple host systems to access the single data storage system allows the host systems to share data stored therein.

SUMMARY OF THE INVENTION

In accordance with one aspect of the techniques herein is a method of data processing comprising: receiving a data chunk of the data set; determining, in accordance with criteria including a compressibility ratio for the data set and a cost ratio of compression computation cost and entropy computation cost, whether to activate or deactivate entropy computation for the data set, wherein the compressibility ratio is ratio of a number of compressible data chunks of the data set and a number of uncompressible data chunks of the data set; and responsive to determining to activate entropy computation for the data set, performing first processing comprising: determining an entropy value for the data chunk; and determining, in accordance with the entropy value for the data chunk, whether to compress the data chunk. The method may include, responsive to determining to deactivate entropy computation for the data set, performing second processing that omits determining an entropy value for the data chunk, and wherein the second processing may comprise compressing the data chunk and determining a compressed form of the data chunk. The second processing may further comprise: determining whether the compressed form of the data chunk, as compared to an original uncompressed form of the data chunk, achieves at least a threshold level of data reduction; responsive to determining the compressed form of the data chunk achieves at least a threshold level of data reduction, determining the data chunk is compressible and storing the data chunk in the compressed form; and responsive to determining the compressed form of the data chunk does not achieve at least a threshold level of data reduction, determining the data chunk is uncompressible and storing the data chunk in its uncompressed form. The method may include: responsive to determining the data chunk is compressible, incrementing a counter, Nc, denoting the number of compressible chunks of the data set; and responsive to determining the data chunk is uncompressible, incrementing a counter, Nu, denoting the number of uncompressible chunks of the data set. The compressibility ratio for the data set is dynamically determined at a point in time as a ratio of Nc to Nu. The criteria may include an inequality that, when evaluated to true, activates entropy computation for the data set and otherwise deactivates entropy computation for the data set. The inequality may be expressed as: Nc/Nu<(the cost ratio−1). The first processing performed responsive to determining to activate entropy computation for the data set may further comprise: determining whether the entropy value for the data chunk is greater than an entropy threshold; responsive to determining that the entropy value for the data chunk is not greater than the entropy threshold, determining that the data chunk is uncompressible and not to compress the data chunk; and responsive to determining that the entropy value for the data chunk is equal to or less than the entropy threshold, compressing the data chunk. Compressing the data chunk performed as part of the first processing may include: determining whether a compressed form of the data chunk, as compared to an original uncompressed form of the data chunk, achieves at least a threshold level of data reduction; responsive to determining the compressed form of the data chunk achieves at least a threshold level of data reduction, determining the data chunk is compressible and storing the data chunk in the compressed form; and responsive to determining the compressed form of the data chunk does not achieve at least a threshold level of data reduction, determining the data chunk is uncompressible and storing the data chunk in its uncompressed form. The method may include: responsive to determining the data chunk is compressible, incrementing a counter, Nc, denoting the number of compressible chunks of the data set; and responsive to determining the data chunk is uncompressible, incrementing a counter, Nu, denoting the number of uncompressible chunks of the data set. The compressibility ratio for the data set may be dynamically determined at a point in time as a ratio of Nc to Nu. The criteria may include an inequality that, when evaluated to true, activates entropy computation for the data set and otherwise deactivates entropy computation for the data set. The inequality may be expressed as Nc/Nu< (the cost ratio−1). The data set may include any one or more of: a database, one or more selected portions of a database, selected data portions used by a particular application, selected data portions stored on one or more logical devices, one or more files, one or more directories, one or more file systems, selected portions of one or more directories, and selected portions of one or more file systems. The first processing and the second processing may be performed inline as part of I/O path processing for the data chunk.

In accordance with another aspects of techniques herein is a system comprising: a processor; and a memory comprising code stored thereon that, when executed, performs a method of data processing comprising: receiving a data chunk of the data set; determining, in accordance with criteria including a compressibility ratio for the data set and a cost ratio of compression computation cost and entropy computation cost, whether to activate or deactivate entropy computation for the data set, wherein the compressibility ratio is ratio of a number of compressible data chunks of the data set and a number of uncompressible data chunks of the data set; and responsive to determining to activate entropy computation for the data set, performing first processing comprising: determining an entropy value for the data chunk; and determining, in accordance with the entropy value for the data chunk, whether to compress the data chunk.

In accordance with another aspect of techniques herein is a computer readable medium comprising code stored thereon that, when executed, performs a method of data processing comprising: receiving a data chunk of the data set; determining, in accordance with criteria including a compressibility ratio for the data set and a cost ratio of compression computation cost and entropy computation cost, whether to activate or deactivate entropy computation for the data set, wherein the compressibility ratio is ratio of a number of compressible data chunks of the data set and a number of uncompressible data chunks of the data set; and responsive to determining to activate entropy computation for the data set, performing first processing comprising: determining an entropy value for the data chunk; and determining, in accordance with the entropy value for the data chunk, whether to compress the data chunk. The method may further comprise: responsive to determining to deactivate entropy computation for the data set, performing second processing that omits determining an entropy value for the data chunk, and wherein the second processing may include compressing the data chunk and determining a compressed form of the data chunk. The second processing may further comprise: determining whether the compressed form of the data chunk, as compared to an original uncompressed form of the data chunk, achieves at least a threshold level of data reduction; responsive to determining the compressed form of the data chunk achieves at least a threshold level of data reduction, determining the data chunk is compressible and storing the data chunk in the compressed form; and responsive to determining the compressed form of the data chunk does not achieve at least a threshold level of data reduction, determining the data chunk is uncompressible and storing the data chunk in its uncompressed form. The method may include: responsive to determining the data chunk is compressible, incrementing a counter, Nc, denoting the number of compressible chunks of the data set; and responsive to determining the data chunk is uncompressible, incrementing a counter, Nu, denoting the number of uncompressible chunks of the data set.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
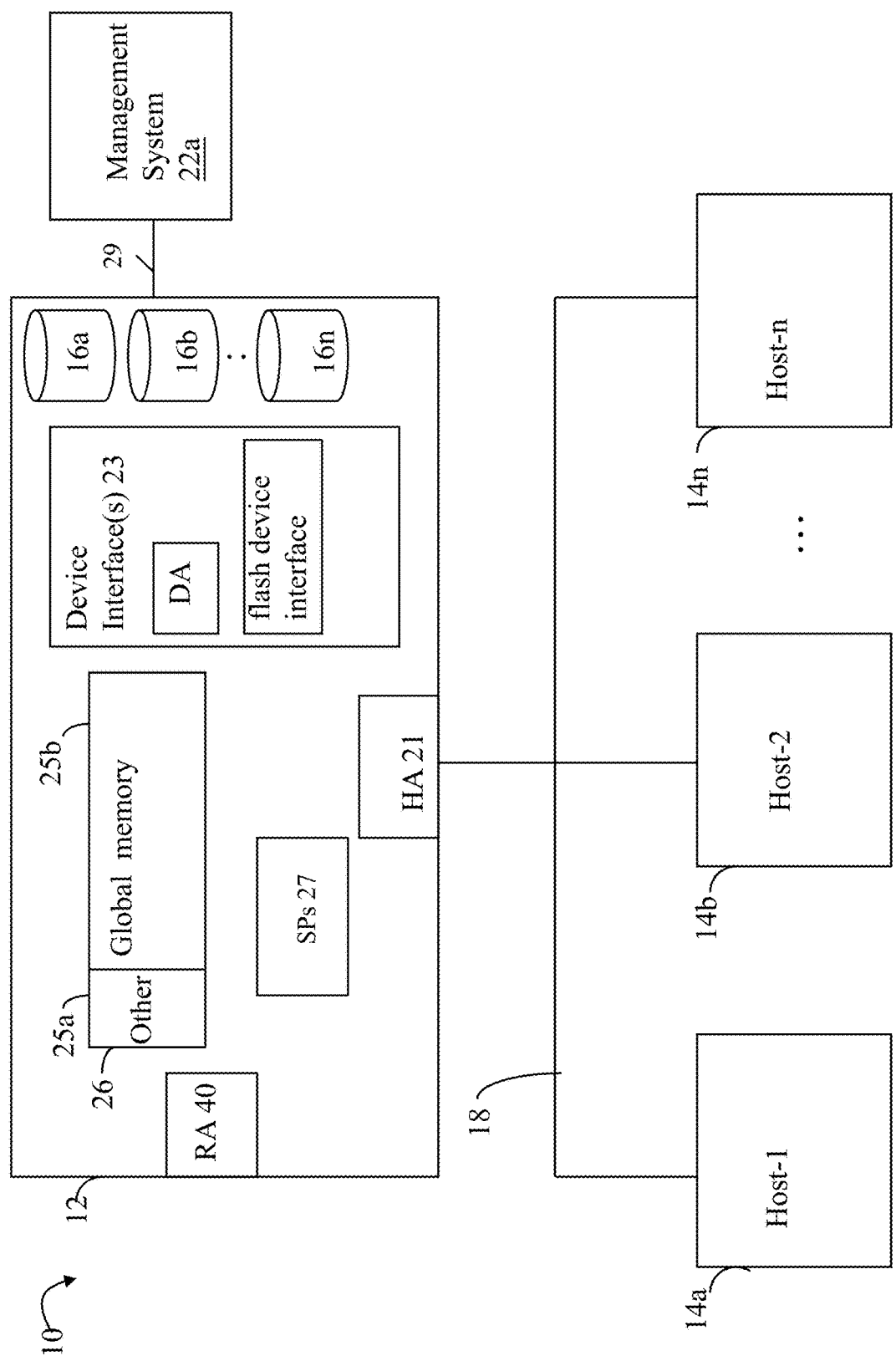
FIGS. 1 and 2B are examples of components that may be included in a system in accordance with techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as block-based protocols (e.g., SCSI, Fibre Channel, iSCSI), file system-based protocols (e.g., NFS), and the like. Some or all of the connections by which the hosts and data storage system may be connected to the communication medium may pass through other communication devices, such switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN (storage area network) or LAN (local area network), in an embodiment using the techniques herein. It should also be noted that an embodiment may include data storage arrays or other components from one or more vendors. In subsequent examples illustrated the techniques herein, reference may be made to a single data storage array by a vendor. However, as will be appreciated by those skilled in the art, the techniques herein are applicable for use with other data storage arrays by other vendors and with other components than as described herein for purposes of example.

The data storage system 12 may be a data storage appliance or a data storage array including a plurality of data storage devices (PDs) 16a-16n. The data storage devices 16a-16n may include one or more types of data storage devices such as, for example, one or more rotating disk drives and/or one or more solid state drives (SSDs). An SSD is a data storage device that uses solid-state memory to store persistent data. SSD may refer to solid state electronics devices as distinguished from electromechanical devices, such as hard drives, having moving parts. Flash devices or flash memory-based SSDs are one type of SSD that contains no moving mechanical parts. The flash devices may be constructed using nonvolatile semiconductor NAND flash memory. The flash devices may include, for example, one or more SLC (single level cell) devices and/or MLC (multi level cell) devices.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from the host. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. The DAs may also be characterized as back end components of the data storage system which interface with the physical data storage devices.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a system cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices, logical volumes (LVs) which may also referred to herein as logical units (e.g., LUNs). A logical unit (LUN) may be characterized as a disk array or data storage system reference to an amount of disk space that has been formatted and allocated for use to one or more hosts. A logical unit may have a logical unit number that is an I/O address for the logical unit. As used herein, a LUN or LUNs may refer to the different logical units of storage which may be referenced by such logical unit numbers. The LUNs may or may not correspond to the actual or physical disk drives or more generally physical storage devices. For example, one or more LUNs may reside on a single physical disk drive, data of a single LUN may reside on multiple different physical devices, and the like. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LUN (s) residing thereon. A flash device interface may be another type of device interface used in connection with facilitating data transfers to/from the associated flash devices and LUN(s) residing thereon. It should be noted that an embodiment may use the same or a different device interface for one or more different types of devices than as described herein.

In an embodiment in accordance with techniques herein, the data storage system as described may be characterized as having one or more logical mapping layers in which a logical device of the data storage system is exposed to the host whereby the logical device is mapped by such mapping layers of the data storage system to one or more physical devices. Additionally, the host may also have one or more additional mapping layers so that, for example, a host side logical device or volume is mapped to one or more data storage system logical devices as presented to the host.

It should be noted that although examples of techniques herein may be made with respect to a physical data storage system and its physical components (e.g., physical hardware for each HA, DA, HA port and the like), techniques herein may be performed in a physical data storage system including one or more emulated or virtualized components (e.g., emulated or virtualized ports, emulated or virtualized DAs or HAs), and also a virtualized or emulated data storage system including virtualized or emulated components.

Also shown in FIG. 1 is a management system 22a that may be used to manage and monitor the system 12. In one embodiment, the management system 22a may be a computer system which includes data storage system management software or application such as may execute in a web browser. A data storage system manager may, for example, view information about a current data storage configuration such as LUNs, storage pools, and the like, on a user interface (UI) in a display device of the management system 22a. Alternatively, and more generally, the management software may execute on any suitable processor in any suitable system. For example, the data storage system management software may execute on a processor of the data storage system 12.

It should be noted that each of the different adapters, such as HA 21, DA or disk interface, RA, and the like, may be implemented as a hardware component including, for example, one or more processors, one or more forms of memory, and the like. Code may be stored in one or more of the memories of the component for performing processing.

The device interface, such as a DA, performs I/O operations on a physical device or drive 16a-16n. In the following description, data residing on a LUN may be accessed by the device interface following a data request in connection with I/O operations. For example, a host may issue an I/O operation which is received by the HA 21. The I/O operation may identify a target location from which data is read from, or written to, depending on whether the I/O operation is, respectively, a read or a write operation request. The target location of the received I/O operation may be expressed in terms of a LUN and logical address or offset location (e.g., LBA or logical block address) on the LUN. Processing may be performed on the data storage system to further map the target location of the received I/O operation, expressed in terms of a LUN and logical address or offset location on the LUN, to its corresponding physical storage device (PD) and location on the PD. The DA which services the particular PD may further perform processing to either read data from, or write data to, the corresponding physical device location for the I/O operation.

It should be noted that an embodiment of a data storage system may include components having different names from that described herein but which perform functions similar to components as described herein. Additionally, components within a single data storage system, and also between data storage systems, may communicate using any suitable technique that may differ from that as described herein for exemplary purposes. For example, element 12 of FIG. 1 may be a data storage system, such as the Dell EMC Unity® data storage system. that includes multiple storage processors (SPs). Each of the SPs 27 may be a CPU including one or more "cores" or processors and each may have their own memory used for communication between the different front end and back end components rather than utilize a global memory accessible to all storage processors. In such embodiments, memory 26 may represent memory of each such storage processor.

Generally, techniques herein may be used in connection with any suitable storage system, appliance, device, and the like, in which data is stored. For example, an embodiment may implement techniques herein using a midrange data storage system, such as a Dell EMC Unity® data storage system, as well as a high end or enterprise data storage system, such as a Dell EMC™ PowerMAX™ data storage system.

The data path or I/O path may be characterized as the path or flow of I/O data through a system. For example, the data or I/O path may be the logical flow through hardware and software components or layers in connection with a user, such as an application executing on a host (e.g., more generally, a data storage client) issuing I/O commands (e.g., SCSI-based commands, and/or file-based commands) that read and/or write user data to a data storage system, and also receiving a response (possibly including requested data) in connection such I/O commands.

The control path, also sometimes referred to as the management path, may be characterized as the path or flow of data management or control commands through a system. For example, the control or management path may be the logical flow through hardware and software components or layers in connection with issuing data storage management command to and/or from a data storage system, and also receiving responses (possibly including requested data) to such control or management commands. For example, with reference to FIG. 1, the control commands may be issued from data storage management software executing on management system 22a to the data storage system 12. Such commands may be, for example, to establish or modify data services, provision storage, perform user account management, and the like. For example, commands may be issued over the control path to provision storage for LUNs, create a snapshot, define conditions of when to create another snapshot, define or establish local and/or remote replication services, define or modify a schedule for snapshot or other data replication services, define a RAID group, obtain data storage management and configuration information for display in a graphical user interface (GUI) of a data storage management program or application, generally modify one or more aspects of a data storage system configuration, list properties and status information regarding LUNs or other storage objects (e.g., physical and/or logical entities in the data storage system), and the like.

The data path and control path define two sets of different logical flow paths. In at least some of the data storage system configurations, at least part of the hardware and network connections used for each of the data path and control path may differ. For example, although both control path and data path may generally use a network for communications, some of the hardware and software used may differ. For example, with reference to FIG. 1, a data storage system may have a separate physical connection 29 from a management system 22a to the data storage system 12 being managed whereby control commands may be issued over such a physical connection 29. However, it may be that user I/O commands are never issued over such a physical connection 29 provided solely for purposes of connecting the management system to the data storage system. In any case, the data path and control path each define two separate logical flow paths.

An embodiment of a data storage system in accordance with techniques herein may perform different data processing operations or services on stored user data. For example, the data storage system may perform one or more data reduction operations, such as data deduplication and compression, as well as other types of operations or services. Such data reduction operations attempt to reduce the amount of storage needed for storing data on non-volatile backend storage devices (e.g., PDs) with the goal of reducing the cost per unit of storage consumed (e.g., dollar cost per GB of storage). Generally, data deduplication and compression techniques are known in the art and any suitable such technique may be used in an embodiment in accordance with techniques herein. In at least one embodiment, the compression technique may be a lossless compression technique such as an algorithm from the Lempel Ziv algorithm family (e.g., LZ77, LZ78, LZW, LZR, and the like). In at least one embodiment in accordance with techniques herein, data deduplication processing performed may include digest or hash value computation using an algorithm such as based on the SHA-256 hashing algorithm known in the art. Data deduplication generally refers to removing redundant or duplicate data portions. Data deduplication techniques may include looking for duplicate data chunks whereby only a single instance of the data chunk is retained (stored on physical storage) and where pointers or references may be used in connection with duplicate or redundant copies (which reference or identify the single stored instance of the data chunk).

Figure 2A:
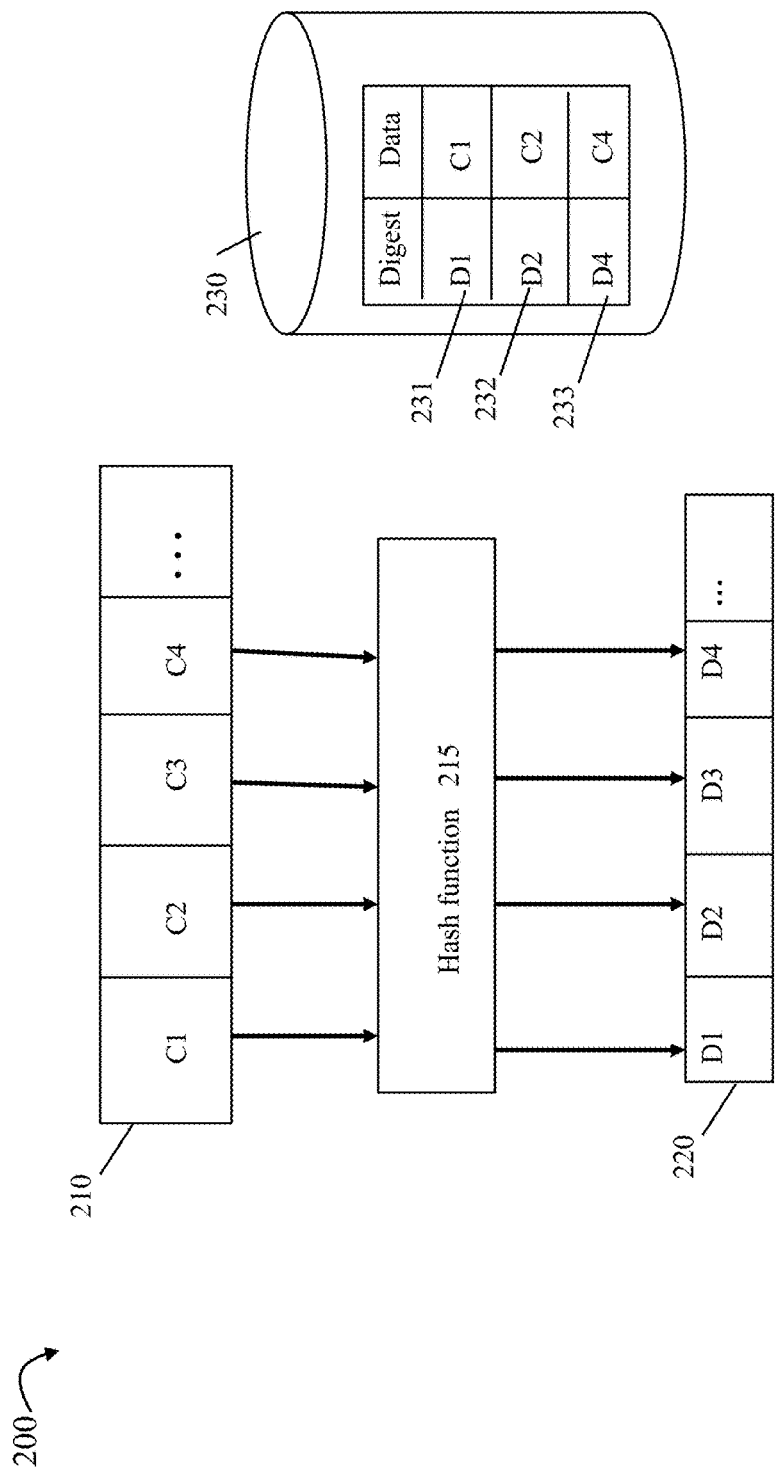
FIG. 2A is an example illustrating data deduplication as may be performed in an embodiment in accordance with techniques herein.

Referring to FIG. 2A, shown is an example 200 illustrating processing that may be performed in connection with data deduplication processing in an embodiment in accordance with techniques herein. Element 210 may denote the original data being written or stored on back-end non-volatile storage. The original data may be partitioned into multiple data chunks C1, C2, C3, C4 and the like. In at least one embodiment and for purposes of illustration, the data chunks may all be the same size where the size may vary with embodiment. As a variation depending on the data deduplication technique utilized, the chunks of 210 may be of varying or different sizes. Each chunk is provided as an input to hash function 215. As noted above, in at least one embodiment, the hash function 215 may be the SHA-256 hashing algorithm, or more generally, any suitable cryptographic hashing function known in the art. For each chunk of 210, the hash function 215 may perform processing and generate, as an output, a hash value or digest. Element 220 includes digests D1, D2, D3, D4, and the like, where a corresponding different one of the digests DN is generated for one of the chunks CN (where "N" is an integer denoting the chunk and associated digest generated for that chunk). For example, D1 is the digest generated for C1, D2 is the digest generated for C2, D3 is the digest generated for C3, and so on. Generally, a hash function 215 is selected which has an acceptably low probability of a "hash collision" of generating the same digest or hash value for two different chunks. The strength of the hash function 215 may be measured by the unlikelihood of a collision occurring two different input chunks of data produce the same digest. The strength increases with the bit length of the hash value or digest. Thus, if two chunks, such as C1 and C3, have the same digests whereby D1=D3, then chunks C1 and C3 match (e.g., are identical matching data chunks). If two chunks, such as C1 and C4, have different digests whereby D1 does not equal D4, then chunks C1 and C4 do not match (e.g., are different or non-matching data chunks). In cases where two matching or identical chunks have the same digest, only a single copy of the data chunk is stored on backend non-volatile physical storage of the data storage system. The single stored instance of the data chunk may be referenced using a pointer, handle, the digest of the chunk, and the like.

Element 230 of FIG. 2A may denote the data store used to store data chunks. In this example, as noted above, assume chunks C1 and C3 are the same with remaining chunks C2 and C4 being unique. The data store 230 may also be referred to as a single instance store (SIS). In at least one embodiment, element 230 may be organized and managed using a data structure, such as a hash table. In at least one embodiment, computed digests may be used as an index into the hash table where the single unique instances of data chunks may be stored (along with other metadata as may be needed for maintaining the table and also in accordance with the particular hash table management used in an embodiment). Hash tables are data structures known in the art. A hash table uses a hash function to compute an index into an array of buckets or slots, from which the desired data can be found. In this example, the chunk of data may be mapped by hash function 215, and thus by the chunk's digest, to a particular entry in the table at which the chunk data is stored. To further illustrate, the hash function 215 may be used to generate a digest for a particular data chunk. The digest is then further mapped (e.g., such as by another mathematical function, using particular portions of the digest, and the like) to a particular index or entry of the hash table. The particular mapping used to map the digest to a corresponding table entry varies, for example, with the digest and the size of hash table.

When storing a new data chunk, such as C1, its digest may be mapped to a particular hash table entry 231 whereby if the table entry is null/empty, or otherwise does not already include a data chunk matching C1, then C1 is stored in the table entry along with its associated digest D1 (this is the first time chunk C1 is recorded in the data store 230). Otherwise, if there is already an existing entry in the table including a data chunk matching C1, it indicates that the new data chunk is a duplicate of an existing chunk. In this example as noted above, processing is performed for C1, C2, and C4 respectively, where entries 231, 232, and 233 are added since there are no existing matching entries in the hash table. When processing chunk C3, as noted above, C3 has a digest D3 matching D1 whereby C3 (and thus D3) maps to entry 231 of the hash table already including a matching chunk C1 (so no additional data chunk is added to 230 for C3 since C3 is determined as a duplicate of C1). In connection with representing a particular file or other storage entity including multiple duplicate occurrences of a particular chunk such as C3, the single instance or copy of the data may be stored in 230. Additionally, a handle or reference, such as identifying the hash table entry 231, its digest, and the like, may be used to reference the single instance or copy of the data storage in 230. When reconstructing or restoring data such as the file to its original form, the handle or reference into the hash table for chunk C3 may be used to obtain the actual C3 chunk of data from 230.

Figure 2B:
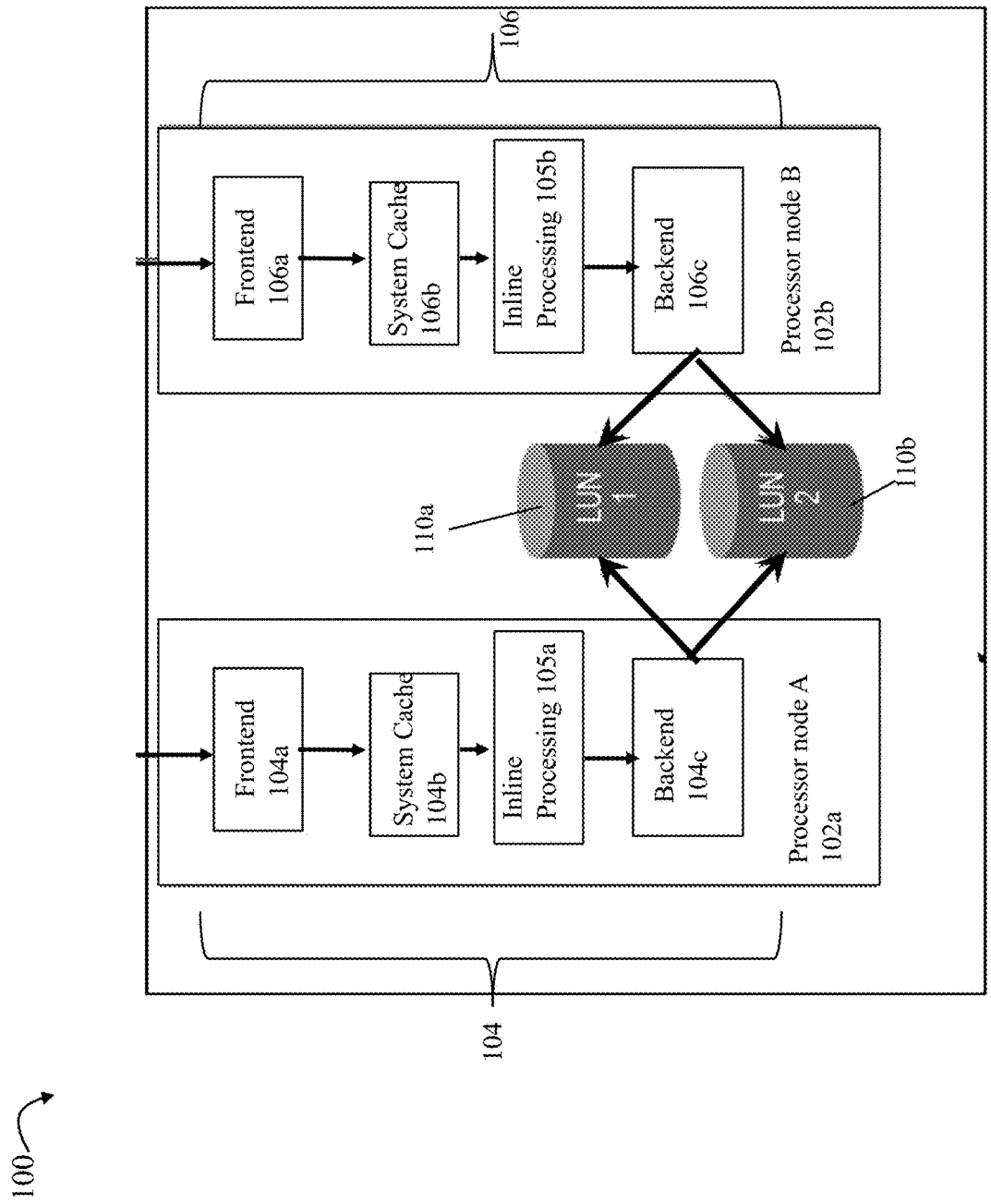

With reference to FIG. 2B, shown is an example 100 illustrating components that may be included in the data path in at least one existing data storage system in accordance with techniques herein. The example 100 includes two processor nodes A 102a and B 102b and associated software stacks 104, 106 of the data path where I/O requests may be received by either processor node 102a or 102b. In the example 200, the data path 104 of processor node A 102a includes: the frontend (FE) component 104a (e.g., an FA or front end adapter) that translates the protocol-specific request into a storage system-specific request; a system cache layer 104b where data is temporarily stored; an inline processing layer 105a; and a backend (BE) component 104c that facilitates movement of the data between the system cache and permanent non-volatile storage (e.g., back end physical non-volatile storage devices accessed by BE components such as DAs as described herein). During movement of data in and out of the system cache layer 104b (e.g., such as in connection with read and writing data respectively, to physical storage 110a, 110b, inline processing may be performed by layer 105a. Such inline processing operations of 105a may be optionally performed and may include any one of more data processing operations in connection with data that is flushed from system cache layer 104b to back-end non-volatile physical storage 110a, 110b, as well as when retrieving data from back-end non-volatile physical storage 110a, 110b to be stored in system cache layer 104b. In at least one embodiment, the inline processing may include performing compression and data duplication. Although in following paragraphs reference may be made to inline processing including compression and data deduplication, more generally, the inline processing may include performing any suitable or desirable data processing operations as part of the I/O or data path (e.g., where such operations may include any of compression and data deduplication, as well as any other suitable data processing operation).

In a manner similar to that as described for data path 104, the data path 106 for processor node B 102b has its own FE component 106a, system cache layer 106b, inline processing layer 105b, and BE component 106c that are respectively similar to components 104a, 104b, 105a and 104c. Elements 110a, 110b denote physical storage provisioned for LUNs whereby an I/O may be directed to a location or logical address to read data from, or write data to, the logical address. The LUNs 110a, 110b are examples of storage objects representing logical storage entities included in an existing data storage system configuration. Since, in this example, writes directed to LUNs 110a, 110b may be received for processing by either of the nodes 102a and 102b, the example 100 illustrates what may also be referred to as an active-active configuration.

In connection with a write operation as may be received from a host and processed by processor node A 102a, the write data may be written to the system cache 104b, marked as write pending (WP) denoting it needs to be written to physical storage 110a, 110b and, at a later point in time, the write data may be destaged or flushed from the system cache to the physical storage 110a, 110b by the BE component 104c. The write request may be considered complete once the write data has been stored in the system cache whereby an acknowledgement regarding the completion may be returned the host (e.g., by component 104a). At various points in time, WP data stored in the system cache is flushed or written out to physical storage 110a, 110b. In connection with inline processing layer 105a, prior to storing the original data on physical storage 110a, 110b, compression and data deduplication processing may be performed that converts the original data (as stored in the system cache prior to inline processing) to a resulting form (that may include compressed and/or deduplicated portions) which is then written to physical storage 110a, 110b. In at least one embodiment, when deduplication processing determines that a portion (such as a chunk) of the original data is a duplicate of an existing data portion already stored on 110a, 110b, that particular portion of the original data is not stored in a compressed form and may rather be stored in its deduplicated form (e.g., there is no need for compression of a chunk determined to be duplicate of another existing chunk). If the original data portion is not a duplicate of an existing portion already stored on 110a, 110b, the original data portion may be compressed and stored in its compressed form on 110a, 110b.

In connection with a read operation to read a chunk of data, a determination is made as to whether the requested read data chunk is stored in its original form (in system cache 104b or on physical storage 110a, 110b), or whether the requested read data chunk was previously deduplicated or compressed. If the requested read data chunk (which is stored in its original decompressed, non-deduplicated form) is in system cache, the read data chunk is retrieved from the system cache 104b and returned to the host. Otherwise, if the requested read data chunk is not in system cache 104b but is stored on physical storage 110a, 110b in its original form, the requested data chunk is read by the BE component 104c from the backend storage 110a, 110b, stored in the system cache and then returned to the host.

If the requested read data chunk was previously deduplicated, the read data chunk is recreated and stored in the system cache in its original form so that it can be returned to the host. If the requested read data chunk was previously compressed, the chunk is first decompressed prior to sending the read data chunk to the host. If the compressed read data chunk is already stored in the system cache, the data is uncompressed to a temporary or buffer location, the uncompressed data is sent to the host, and the buffer or temporary location is released. If the compressed read data chunk is not in system cache but stored on physical storage 110a, 110b, the compressed read data chunk may be read from physical storage 110a, 110b into system cache, uncompressed to a buffer or temporary location, and then returned to the host. Thus, requested read data stored on physical storage 110a, 110b may be stored in a deduplicated or compressed form as noted above where processing is performed by 105a to restore or convert the deduplicated or compressed form of the data to its original data form prior to returning the requested read data to the host.

In connection with techniques herein, each processor or CPU may include its own private dedicated CPU cache (also sometimes referred to as processor cache) that is not shared with other processors. In at least one embodiment, the CPU cache, as in general with cache memory, may be a form of fast memory (relatively faster than main memory which may be a form of RAM). In at least one embodiment, the CPU or processor cache is on the same die or chip as the processor and typically, like cache memory in general, is far more expensive to produce than normal RAM such as may be used as main memory. Processor cache is substantially faster than the system RAM such as used as main memory and contains information that the processor will be immediately and repeatedly accessing. The faster memory of the CPU cache may, for example, run at a refresh rate that's closer to the CPU's clock speed, which minimizes wasted cycles. In at least one embodiment, there may be two or more levels (e.g., L1, L2 and L3) of cache. The CPU or processor cache may include at least an L1 level cache that is the local or private CPU cache dedicated for use only by that particular processor. The two or more levels of cache in a system may also include at least one other level of cache (LLC or lower level cache) that is shared among the different CPUs. The L1 level cache serving as the dedicated CPU cache of a processor may be the closest of all cache levels (e.g., L1-L3) to the processor which stores copies of the data from frequently used main memory locations. Thus, the system cache as described herein may include the CPU cache (e.g., the L1 level cache or dedicated private CPU/processor cache) as well as other cache levels (e.g., the LLC) as described herein. Portions of the LLC may be used, for example, to initially cache write data which is then flushed to the backend physical storage.

When the processor performs processing, such as in connection with inline processing 105a, 105b as noted above, data may be loaded from main memory and/or other lower cache levels into its CPU cache. In particular, inline compression (ILC) and inline data deduplication (ILD) may be performed as part of inline processing 105a, 105b. In at least one embodiment, the size of a data chunk processed by ILC and ILD may be 256 bytes.

Compression processing such as performed by ILC threads is generally a CPU intensive operation. However, as discussed in more detail herein, there is a relationship between entropy and data compression where a computed entropy value for a data chunk may denote a measure or degree of compressibility of the data chunk. Generally, computation of an entropy value for a data chunk may be characterized as lightweight in terms of CPU requirements as opposed to performing compression processing for the data chunk. In an embodiment in accordance with techniques herein, the computed entropy value for a data chunk may be used in determining whether or not to proceed with compressing the data chunk. The foregoing is generally more CPU efficient than actually compressing each data chunk in order to determine whether or not it (the data chunk) is compressible (and should therefore be stored in its compressed form), or otherwise achieves at least a minimum amount of data reduction (e.g., whether or not a compressed form of a data chunk has a reduced size that is less than the size of the original data chunk by at least a threshold amount) to warrant storing the chunk in its compressed form.

Information entropy may be characterized as the average rate at which information is produced by a stochastic source of data. The definition of entropy used in information theory is analogous to the definition used in statistical thermodynamics. The concept of information entropy was introduced by Claude Shannon in "A Mathematical Theory of Communication", The Bell System Technical Journal (Volume: 27, Issue: 3, July 1948; pages 379-423). The measure of information entropy associated with each possible data value may be expressed as the negative logarithm of the probability mass function for the value. When the data source has a lower-probability value (i.e., when a low-probability event occurs), the event carries more "information" ("surprisal") than when the source data has a higher-probability value. The amount of information conveyed by each event defined in this way becomes a random variable whose expected value is the information entropy. Generally, entropy refers to disorder or non-uniformity. As a metric, an entropy value denotes a measure of the randomness of data, or a random distribution of symbols.

The relationship between entropy and compressibility is discussed, for example, in "Relationship Between Entropy and Test Data Compression", Kedarnath J. Balakrishnan and Nur A. Touba, IEEE Transactions on Computer-Aided Design of Integrated Circuits and Systems, Vol. 26, No. 2, February 2007, pages 386-395, and "Entropy and Compressibility of Symbol Sequences", Werner Ebeling, Phys-Comp96 (Physics and Computation 1996), Feb. 23, 1997, both of which are incorporated by reference herein. As explained in "Relationship between Entropy and Test Data Compression", entropy of a data set is a measure of the amount of information in the data set. Entropy calculations for fully specified data have been used to get a theoretical bound on how much the data can be compressed. In "Relationship between Entropy and Test Data Compression", the concept of entropy is extended for incompletely specified test data that has unspecified or don't care bits. "Entropy and Compressibility of Symbol Sequences" investigates long-range correlations in symbol sequences using methods of statistical physic and non-linear dynamics.

Entropy, H, with respect to a data set may be expressed as:

$$H = -\Sigma_{i=0}^{N-1} P_i \log_2(P_i) \qquad \text{EQUATION 1}$$

Where $P_i$ is the probability of occurrence of symbol $X_i$ in the data set;

N is the total number of unique symbols; and $\log_2$ is the base 2 logarithm.

Generally, entropy for the data set depends on the symbol length L. Assume the data set is partitioned into sections where each section includes L bits of data. Thus L denotes number of bits in each section and L also denotes the length of the symbol. For a given symbol length, entropy for the data may be calculated to provide a value that denotes an expected or predicted level of compressibility for the data. Note that $P_i$, the probability of symbol $X_i$, refers to the actual frequency of the symbol $X_i$ in the data set. Thus, $P_i$ for $X_i$ may be calculated as the frequency or number of times $X_i$ appears in the data set divided by the total number of sections in the data set.

It should be noted, although particular values are selected for purposes of illustration, generally the entropy value used with techniques herein may be included for any size data chunk or data set that may include symbols of any suitable number of bits (e.g., any symbol length) having any number of unique symbols.

In at least one embodiment in accordance with techniques herein, L may be 8 where each symbol may include 8 bits (e.g., have a symbol length of 8). In such an embodiment, each symbol or bit pattern of 8 bits denotes a byte of information having a numerical data value (base 10) in the range from 0 to 255, inclusively. In such an embodiment, N, the number of unique symbols (e.g., numerical value of bit patterns) is 256, and EQUATION 1 for calculating entropy, H, may be expressed as:

$$H = -\sum_{i=0}^{255} P_i \log_2(P_i) \qquad \text{EQUATION 2}$$

The entropy values calculated using EQUATION 1 and EQUATION 2 are (e.g., real numbers) within the inclusive range of 0 to 8, where 0 denotes the maximum expected level of compressibility of the data set and 8 denotes the minimum expected level of compressibility of the data set. For a given data set, the larger the entropy value (e.g., closer to 8), the more random the data and the less compressible the data set; and the smaller or lower the entropy value (e.g., close to 0), the more uniform the data and the more compressible the data set.

In at least one embodiment, an entropy value may be determined for each 8 KB (kilobyte) chunk. Thus, each 8 KB chunk includes 8192 bytes (e.g., 8*1024).

Figure 3:
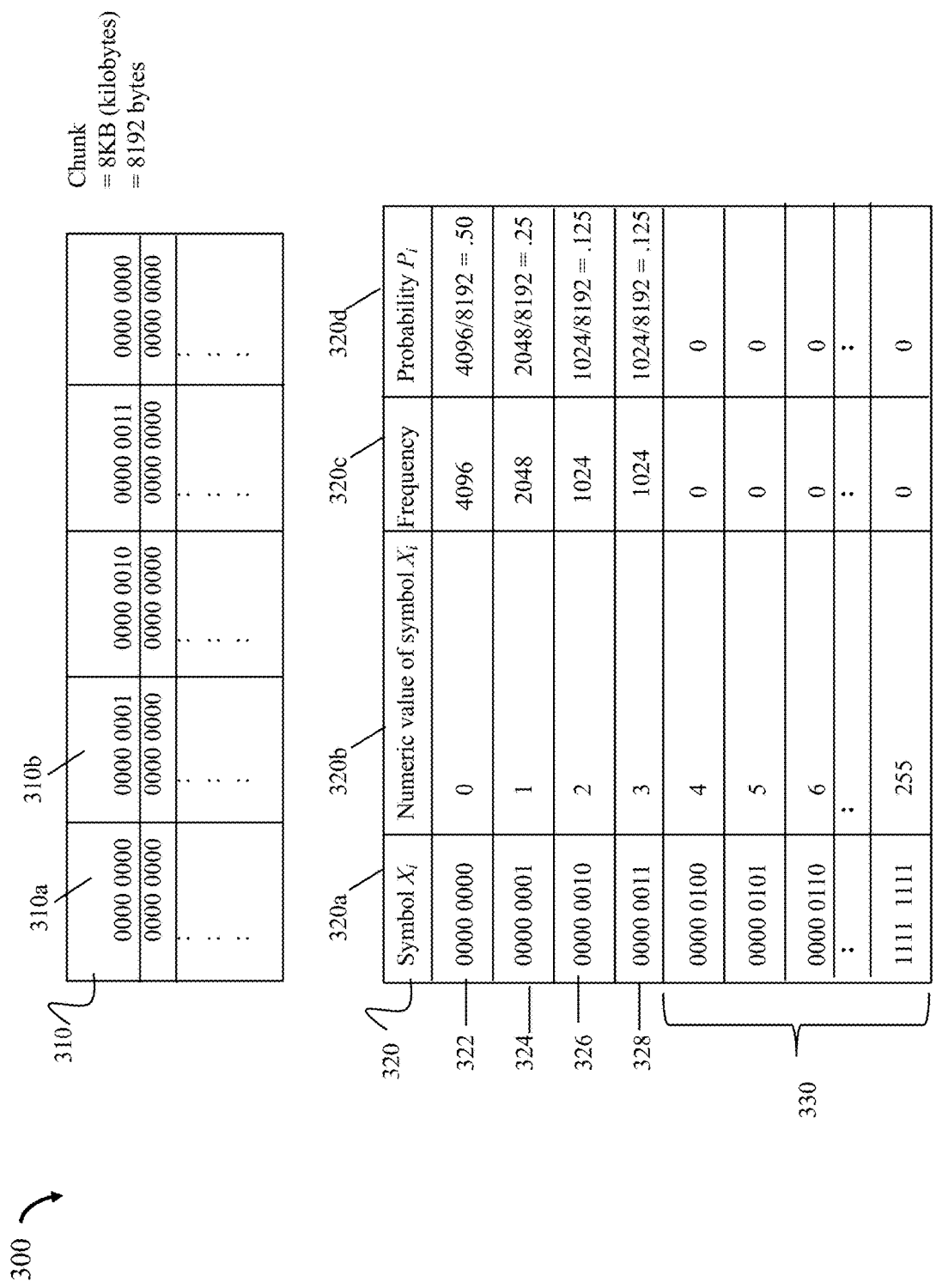
FIG. 3 is an example illustrating a data chunk and associated information that may be used in connection with calculating an entropy value for the data chunk an embodiment in accordance with techniques herein.

Referring to FIG. 3, shown is an example 300 illustrating a data chunk and associated information that may be used in an embodiment in accordance with techniques herein. The example 300 includes data chunk 310 having a size of 8 KB. The data chunk 310 may be partitioned into bytes or 8 bit segments where each byte denotes a symbol having a numeric value from 0 to 255, inclusively. For example, element 310a denotes a byte or symbol having a value of 0 and element 310b denotes a byte or symbol having a value of 1. To calculate the entropy for chunk 310, information in table 320 may be determined. Table 320 includes the following columns: symbol $X_i$ 320a, numeric value of symbol $X_i$ 320b, frequency of $X_i$ 320c and probability $P_i$. Each row of 320 includes a set of information for each unique symbol that can occur in the chunk. Thus, table 320 may include 256 rows, one row for each of the unique symbols having corresponding numeric values from 0 to 255, inclusively. Row 322 denotes that the numeric value 0 for symbol "0000 0000" has a frequency of 4096 and a probability $P_i$=0.50. Row 324 denotes that the numeric value 1 for symbol "0000 0001" has a frequency of 2048 and a probability $P_i$=0.25. Row 326 denotes that the numeric value 2 for symbol "0000 0010" has a frequency of 1024 and a probability $P_i$=0.125. Row 328 denotes that the numeric value 3 for symbol "0000 0011" has a frequency of 1024 and a probability $P_i$=0.125. Element 330 indicates that the remaining symbols each have a frequency=0 and thus a probability $P_i$=0. Based on EQUATION 2 and using the information from table 320 for the chunk 310, the calculated entropy value for chunk 310 is 1.75. Based on the range of possible entropy values from 0 to 8, inclusively, an embodiment may use the entropy value of 1.75 to determine whether or not to compress the chunk 310. For example, consistent with discussion herein, an embodiment may perform the entropy calculation for the chunk 310 inline as part of ILC processing of the I/O or data path, when writing or storing chunk 310 to PDs such as illustrated and described in connection with FIG. 2B. Based on the calculated entropy value for the chunk such as may be performed as part of ILC processing, an embodiment may determine whether to perform compression of the chunk inline as part of the I/O or data path.

In at least one embodiment, an entropy threshold may be specified where compression, such as part of ILC, may be performed for chunks having an entropy value less than the threshold. Otherwise, the chunk may not be compressed, such as in connection with ILC processing. Thus, the threshold denotes a maximum allowable entropy level in order for ILC to compress the chunk. Generally, any suitable value for the threshold may be selected. For example, in at least one embodiment, the threshold may be a value within the range of 5.0 to 6.0, inclusively.

Figure 4:
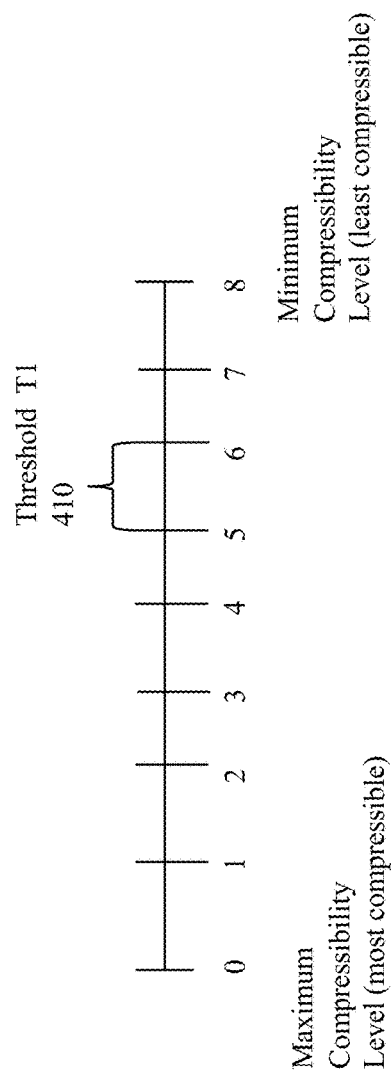
FIG. 4 is an example illustrating selection of an entropy threshold used in an embodiment in accordance with techniques herein.

Reference is made to FIG. 4 illustrating a threshold range within which a threshold for may be selected for use in an embodiment in accordance with techniques herein. The example 400 illustrates the possible range of entropy values from 0 to 8, inclusively where element 410 denotes that the entropy threshold T1 may be a value (e.g., real number) selected within the range of 5.0 to 6.0, inclusively. For example, assume T1 is selected as 6.0 whereby chunks have associated entropy values within the range 0 to 6.0, inclusively, are compressed. With reference to the example described above in connection with FIG. 3 for chunk 310 having an entropy value of 1.75, it may be determined to compress the chunk 310 inline (e.g., to perform compression processing of the chunk such as part of ILC processing).

As noted above, compression processing such as performed by ILC threads is generally a CPU intensive operation. As also described above, since a computed entropy value for a data chunk may denote a measure or degree of compressibility of the data chunk, such an entropy value may be used in determining whether or not the chunk is compressible, or more generally whether the compressed form of the chunk is expected to achieve at least a minimum amount of data reduction to warrant storing the chunk in its compressed form and incurring additional costs associated with such (e.g., additional CPU processing to decompress the chunk when reading the chunk from physical storage where the compressed form of the chunk is stored). Thus, as discussed above, the entropy value for a data chunk may be used in determining whether or not to actually proceed with compressing the data chunk. However, sometimes entropy computation itself may be an unnecessary overhead, for example, if entropy computation is performed too often on chunks which are also compressed. In such cases, it would have been less CPU time to just compress the data and omit computation of the entropy value for the data.

To illustrate, consider the following example in an embodiment in which processing may first determine whether the data chunk is a duplicate of an existing chunk and thus dedupable, whereby compression of a data chunk is performed only if the data chunk is not a duplicate of an existing chunk (e.g., not dedupable). For example, if all the data of a data set is not dedupable but is compressible thereby achieving at least a minimum amount of data reduction in its compressed form, then entropy computation may be an unnecessary overhead. In such cases, it would have been more computationally efficient consuming less CPU time if entropy computation had been omitted and processing proceeded directly to compression processing. On the other hand, if all the data in the data set is not dedupable and also deemed uncompressible, or more generally does not achieve at least a threshold amount or rate of data reduction in its compressed form, then performing entropy computation beforehand and using the chunk's computed entropy metric as a means to determine whether or not to proceed with compressing the data provides for better CPU computation efficiency by avoiding the unnecessary compression processing of uncompressible data.

Described in following paragraphs are additional techniques that may be used to further selectively activate and deactivate entropy computation. Such techniques may be based on metrics and heuristics regarding statistical data compressibility, such as historical data, of a data set and chunks thereof. Generally, such additional techniques provide for further CPU efficiency to avoid entropy computations on data which is determined using the additional techniques (e.g., based on statistical data compressibility) to be compressible.

In connection with the additional techniques described herein, processing may be performed using heuristics and particular metrics of a data set to define a threshold condition or criteria (e.g., also referred to as an inequality such as in connection with EQUATIONS 3A, 3B, and 3C elsewhere herein) used for determining when to selectively turn entropy computation on and off, such as for a particular data chunk of the data set. In connection with techniques herein, the data set may be any defined set of stored data such as, for example, a database, one or more selected portions or logical address space portions of a database, data used by a particular application stored on one or more LUNs, selected portions of one or more LUNs, one or more files, one or more directories, one or more file systems, particular portions of one or more directories or file systems, and the like.

In at least one embodiment, the following metrics may be maintained for each data set as chunks of the data set are processed:

Nc denoting the total number of compressible chunks or blocks; and

Nu denoting the total number of uncompressible chunks or blocks.

Generally, chunks or blocks may denote a selected storage unit size or granularity used in an embodiment. For example, in at least one embodiment as described herein, each chunk or block may be 8 KB=8192 bytes (e.g., 8*1024). More generally, any suitable chunk size may be used.

In at least one embodiment, a determination of whether a chunk of a data set is compressible (e.g., thereby resulting in incrementing Nc) or uncompressible (e.g., thereby resulting in increment Nu) may be made in connection with an entropy value determined for the chunk (e.g., such as based on EQUATIONS 1 and 2 herein), or the amount or rate of data size reduction achieved as a result of compressing the chunk (e.g., comparison of original chunk size to the resulting size of compressed form of the chunk generated as an output of actual compression of the chunk). For example, a chunk may be determined as uncompressible if its associated entropy value is greater than a specified entropy threshold as discussed above. As another example, a chunk may be determined as uncompressible if the compressed form of the chunk does not result in at least a specified amount of data reduction when compared to the original uncompressed size of the chunk input to compression processing. Thus, in this latter example, the chunk is actually compressed a first time but a determination is made that the chunk is uncompressible since the output of compression processing does not generate a compressed form of the chunk which is at least a specified amount smaller than the original chunk. In at least one embodiment, counters Nc and Nu may be maintained for processed data chunks based entropy values and actual compression rates. For example, in such an embodiment, Nu may be incremented for a chunk having an entropy value greater than a specified threshold even though the chunk is not actually compressed; and Nu may also be incremented for a chunk having an entropy value less than the specified threshold but where the actual compression rate/amount of compression is not at least a specified minimum.

In at least one embodiment, Nc and Nu may be maintained per data set and modified dynamically at runtime as chunks of the data set are received for processing. Thus, in one aspect, Nc and Nu may be characterized as dynamic counters or metrics which are adaptive and change over time as the compressibility characteristic of chunks of data written to the data set may also change over time.

Additionally, in connection with techniques herein, such as in EQUATIONS 3A, 3B, 3C and 3D set forth below, the following costs may be used:

Te denoting the average cost of entropy computation per chunk; and

Tc denoting the average cost of compression per chunk.

Te and Tc may be in any suitable units. For example, in at least one embodiment, Tc and Te may be expressed in terms of computation costs, such as average number of CPU cycles or CPU time to perform, respectively, entropy computation and compression for a single chunk. An embodiment may specify a single set of Te and Tc values used for all data sets, each individual data set, or one or more particularly identified data sets.

The costs Tc and Te may be determined using any suitable technique. Further, Tc and Te may be constants or dynamic values determined at runtime. For example, Tc and Te may be constants that are pre-calculated or predetermined values provided as inputs to processing herein. As another example, Tc and Te may be set to initial values which are further updated dynamically, such as in an ongoing manner, during runtime as a result of observations made during runtime as chunks of a data set are processed. For example, Te and Tc may be maintained as ongoing average values based on observed amounts of CPU time consumed to determine, respectively, entropy values and compressed chunks of a data set. In this latter case, Te and Tc may be updated in an ongoing manner, such as at defined time periods and/or after a specified number of chunks have been processed, based on observed amount of CPU time consumed during runtime to perform actual computation of entropy values and compressed chunks that occurred during the defined time periods. In this latter case, Te and Tc may be characterized as adaptive values that change over time.

Based on Nc, Nu, Tc and Te, the entropy computation for a chunk of a data set may be performed when the following inequality, or more generally, specified criteria, is true:

$$Te*(Nc+Nu)+Tc*Nc<Tc*(Nc+Nu) \qquad \text{EQUATION 3A}$$

wherein Nc, Nu, Tc and Te are as described above (e.g., wherein Nc and Nu may be values maintained for the particular data set, and Tc and Tu may be constants or dynamic values for the data set).

EQUATION 3A may be further reduced and alternatively expressed as:

$$Te*(Nc+Nu)<Tc*Nu \qquad \text{EQUATION 3B}$$

EQUATION 3B may be further reduced and alternatively expressed as:

$$Nc/Nu+1<Tc/Te \qquad \text{EQUATION 3C}$$

EQUATION 3C may be further reduced and alternatively expressed as:

$$Nc/Nu<Tc/Te-1 \qquad \text{EQUATION 3D}$$

Generally, the foregoing EQUATIONS 3A, 3B, 3C and 3D represent alternative equivalent forms of the same inequality that may be used in connection with techniques herein whereby if the specified inequality evaluates to true, entropy computation is activated and performed for chunks of the data set having the associated metrics (e.g., Nc, Nu) used when evaluating the inequality.

For example, with reference to EQUATION 3D, when the inequality of EQUATION 3D evaluates to true for a particular data set, entropy computation may be activated and performed for chunks of the data set subsequently processed (e.g., subsequent chunks of data written to the data set). The entropy value for the subsequently received chunk may be used to determine whether or not to perform compression of that particular chunk.

Alternatively, when the inequality of EQUATION 3D evaluates to false for a particular data set, entropy computation may be deactivated and not performed for writes of subsequently processed chunks to the data set. In this case, entropy computation for the chunk is not performed and rather processing may proceed directly to performing compression of that particular chunk.

In this manner, for each data set, processing may be performed using the inequality described above (e.g., such as in connection with any of EQUATIONS 3A, 3B, 3C or 3D) to dynamically determine whether to activate or deactivate entropy computation for one or more subsequently processed chunks, for example, subsequently written to the data set.

As will be appreciated by those skilled in the art, an embodiment may use a further equivalent alternative not specifically described herein that is yet another mathematical equivalent to the above inequality of EQUATIONS 3A, 3B, 3C and 3D. In following paragraphs, particular examples may refer to one particular form or expression of the inequality, such as EQUATION 3D. However, an embodiment may use any of the particular forms of EQUATIONS 3A, 3B, 3C and 3D, as well as other equivalent forms which can be derived in a straightforward manner.

To illustrate, consider the following example for a data set. Suppose compression computation processing is 10 times more costly than entropy computation. In this case, using EQUATION 3D, Tc/Te=10 and Tc/Te−1=9. Thus, as long as Nc/Nu<9, the inequality of EQUATION 3D evaluates to true whereby a determination is made that entropy computation is beneficial and should be performed for subsequently received chunks of the data set. Now, for example, if number of uncompressible blocks is 50%, then Nc=Nu, so Nc/Nu=1. Alternatively, if, for example, the number of uncompressible blocks is 10%, then Nc/Nu=9. Thus, based on the foregoing example in connection with EQUATION 3D where Tc/Te=10 and Tc/Te−1=9, if the number of uncompressible blocks is equal to 10%, or larger than 10%, then entropy computation should be activated for the data set, and, if the number of uncompressible blocks is less than 10%, entropy computation should be deactivated for the data set.

In one aspect, the inequality described herein, such as in EQUATION 3D, is used to statistically determine whether it is beneficial to perform the entropy computation for chunks of a data set in accordance with costs associated with entropy computation and compression computation (e.g., Te and Tc respectively), and also in accordance with a total number of compressible chunks of the data set and a total number of uncompressible chunks of the data set (e.g., Nc and Nu respectively). Further, in particular with reference to EQUATION 3D, the inequality is used to statistically determine whether it is beneficial to perform the entropy computation for chunks of a data set in accordance with a cost ratio of costs associated with compression computation and entropy computation (e.g., the ratio Tc/Te of EQUATION 3D), and also in accordance with a current compressibility ratio or rate for the data set of a total number of compressible data chunks (stored in compressed form) and a total number of uncompressible data chunks (stored in uncompressed form) (e.g., as expressed using the ratio of Nc/Nu for the data set).

When the inequality of EQUATION 3D evaluates to true, whereby the entropy computation is then activated, it means that the inequality of EQUATION 3D statistically indicates that it is beneficial to perform the entropy computation based on currently specified values for Tc, Te, Nc and Nu. Alternatively, when the inequality of EQUATION 3D evaluates to false, whereby the entropy computation is then deactivated, it means that the inequality of EQUATION 3D statistically indicates that it is not beneficial to perform the entropy computation based on currently specified values for Tc, Te, Nc and Nu.

Figure 5:
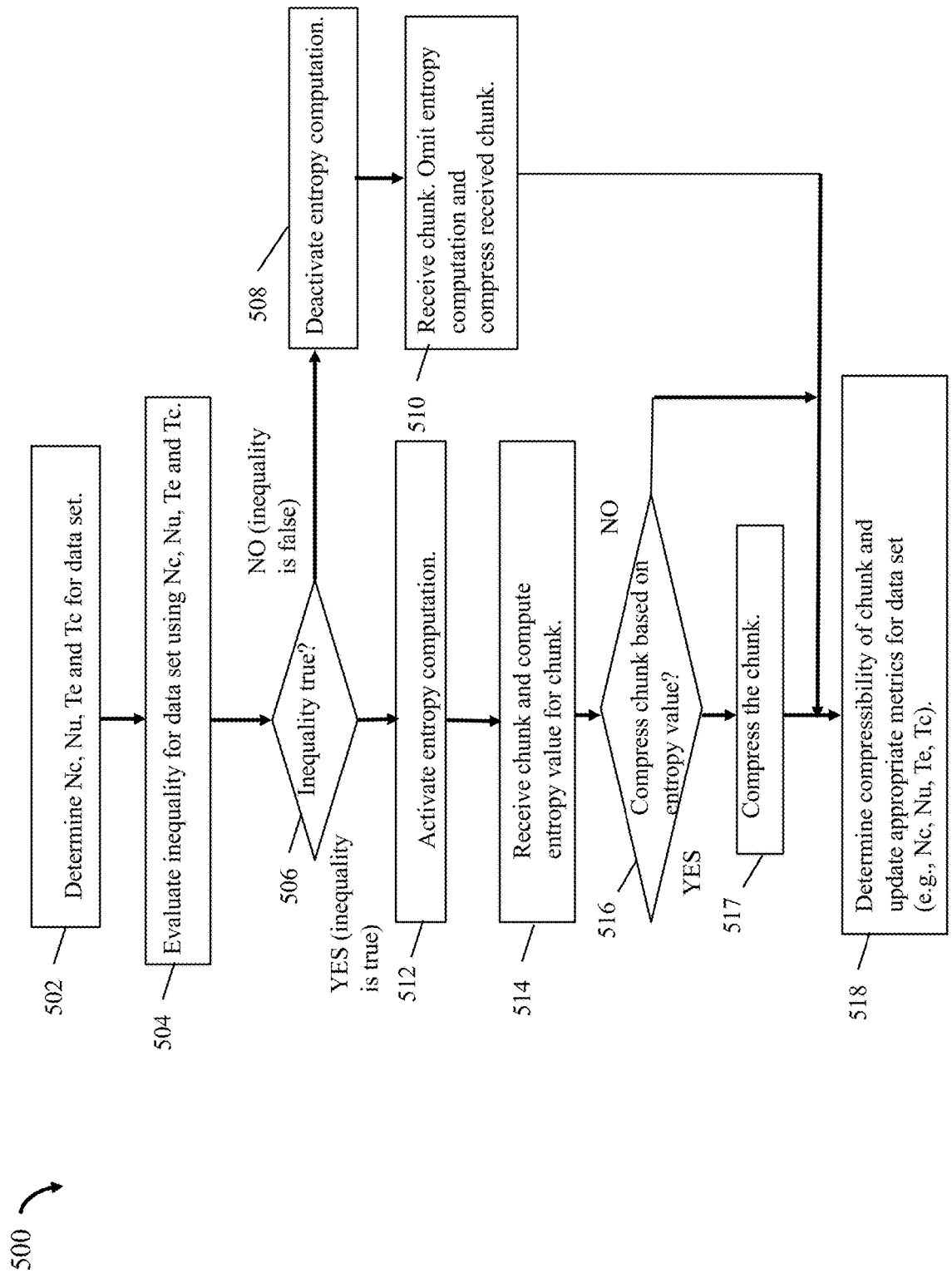
FIGS. 5, 6 and 7 are flowcharts of processing steps that may be performed in an embodiment in accordance with techniques herein.

Referring to FIG. 5, shown is a first flowchart of processing that may be performed in an embodiment in accordance with techniques herein. The flowchart 500 summarizes processing as described above such as may be performed for a single chunk of a data set. At step 502, metric values for Nc, Nu, Te and Tc are determined for a data set. As described herein, such values may be based on historical collected data regarding the data set. Such data may be collected, for example, as chunks of data are written to the data set, by analyzing the data offline (e.g., when not being accessed), and the like. From step 502, control proceeds to step 504 where the inequality, such as of FIG. 3D, is evaluated for the data set using the metrics Nc, Nu, Te and Tc obtained in step 502. From step 504, control proceeds to step 506 where a determination is made as to whether the inequality is true. If step 506 evaluates to no whereby the inequality is false, control proceeds to step 508 where entropy computation for the data set is deactivated. From step 508, control proceeds to step 510 to process a next chunk of the data set where step 510 processing omits entropy computation and proceeds to compress the received chunk. From step 510, control proceeds to step 518. In connection with step 518, compressibility of a chunk may be determined, for example, based on the actual compression rate or amount of compression obtained for the chunk. For example, a chunk may be compressible if at least a specified rate, percentage or amount of size reduction is obtained when comparing the compressed form of the chunk to the uncompressed original chunk. Step 518 processing may also include updating appropriate data set metrics, such as increment either Nc or Nu, based on whether the chunk just processed is compressible or uncompressible. An embodiment may also optionally update Tc, for example, if Tc is being maintained as a dynamic value for the data set.

If step 506 evaluates to yes whereby the inequality is true, control proceeds to step 512 to activate entropy computation. From step 512, control proceeds to step 514 to process a next chunk of the data set where step 514 computes the entropy value for the chunk. From step 514, control proceeds to step 516 where the chunk's entropy value is used to determine whether to compress the chunk. As discussed above, in at least one embodiment, the chunk may be compressed if the chunk's entropy value is below a specified threshold. Otherwise, the chunk is not compressed. Thus, step 516 may determine whether to compress the chunk based on the entropy value computed in step 514 for the chunk. If step 516 evaluates to no whereby the entropy value indicates not to compress the chunk (e.g., chunk is not compressible based on entropy value), processing proceeds directly to step 518 without compressing the chunk. If alternatively step 516 evaluates to yes whereby the entropy value indicates to compress the chunk (e.g., chunk is compressible based on entropy value), processing proceeds to step 517 to compress the chunk. From step 517, processing proceeds to step 518.

At step 518, processing is performed which includes determining the compressibility of the chunk. In connection with the flow from step 516 to step 518, whether a chunk is compressible or uncompressible may be determined based on just the entropy value, since the chunk is not actually compressed. Alternatively, in connection with the flow from step 517 to step 518 where the chunk is actually compressed based on having an associated entropy value below the specified threshold, whether a chunk is compressible may be based on the actual compression rate or amount of compression obtained for the chunk (e.g., comparison of size of compressed chunk form to size of the original uncompressed chunk). Step 518 processing may also include updating appropriate data set metrics, such as increment either Nc or Nu, based on whether the chunk just processed is compressible or uncompressible. An embodiment may also optionally update Te, for example, if Te is maintained as a dynamic value for the data set. Additionally, step 518 may include updating Tc, for example, if Tc is maintained as a dynamic value for the data set and if the chunk just processed was compressed.

Figure 6:
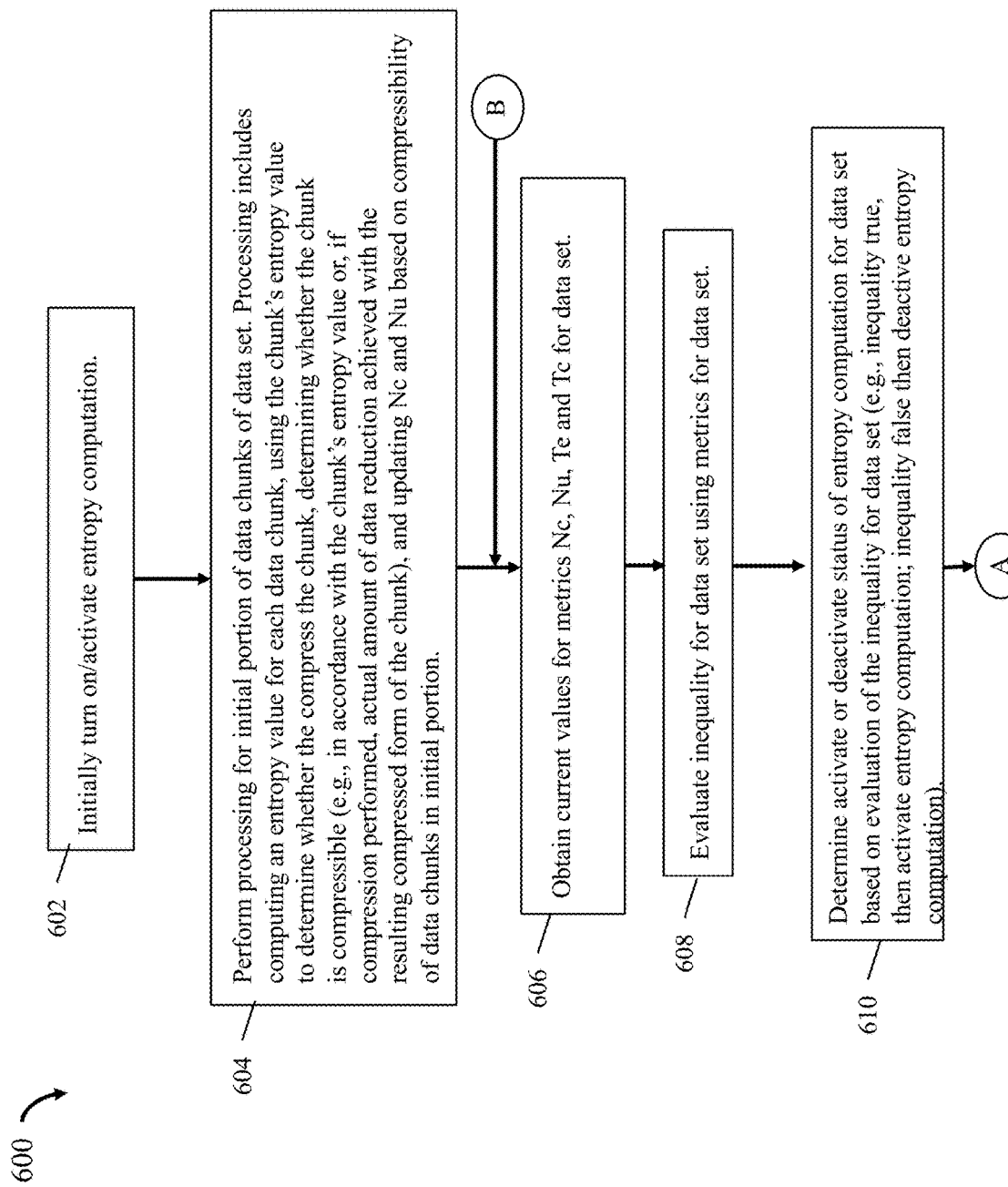
Figure 7:
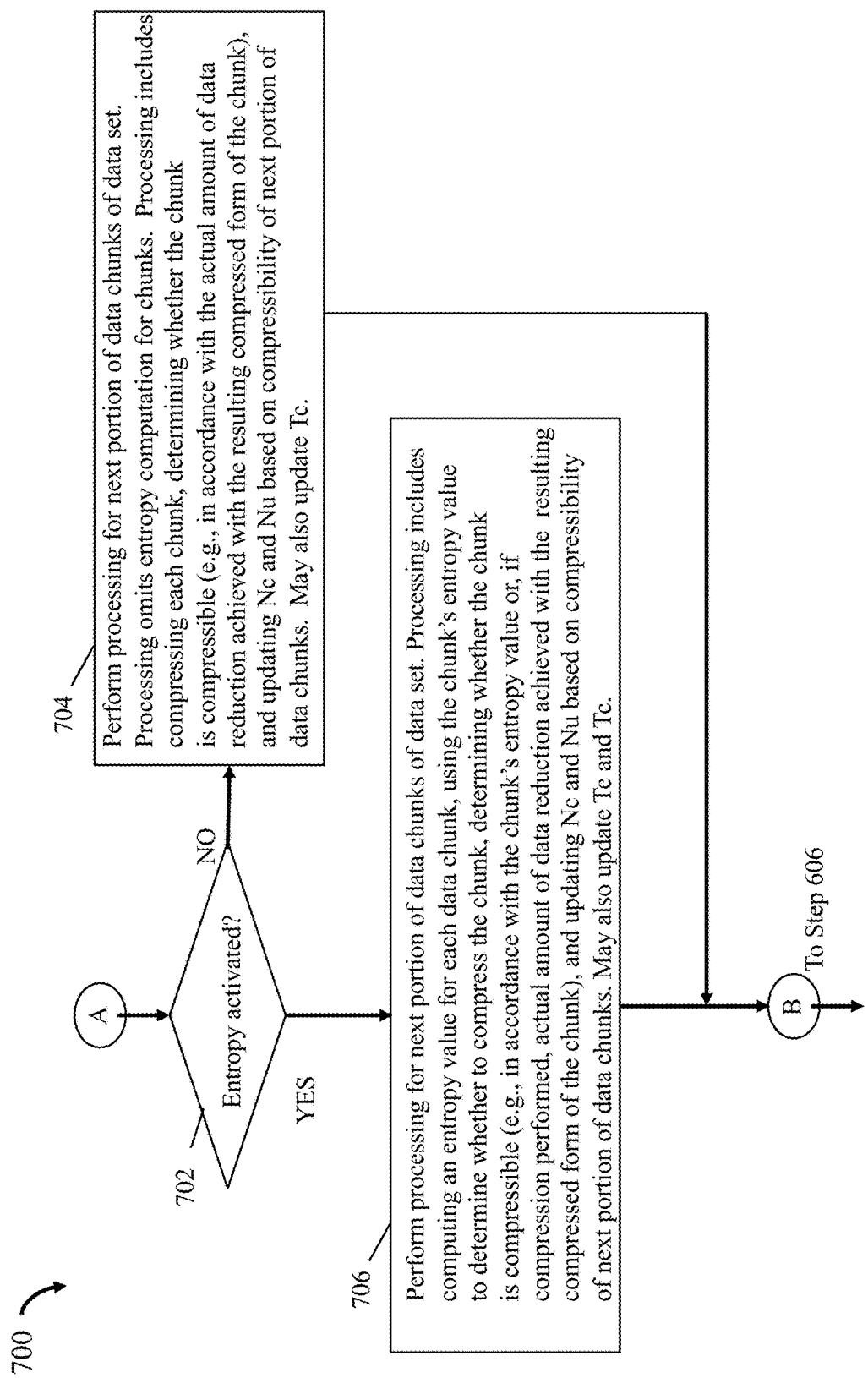

Referring to FIGS. 6 and 7, shown are flowcharts providing further detail regarding processing that may be performed in an embodiment in accordance with techniques herein. The flowcharts 600 and 700 described in following paragraphs describe processing that may be performed for a data set in connection with multiple chunks in an ongoing manner where metrics for the data set may be updated in a continual manner, such as at specified time periods, after processing a specified number of chunks of the data set, and the like. At step 602, entropy computation may be initially activated for the data set. From step 602, control proceeds to step 604 which generally provides for collection of information for an initial time period or for an initial portion of data chunks of the data set in order to determine initial values for the metrics of the data set. In step 604, processing is performed for the initial portion of data chunks of the data set. The processing may include computing an entropy value for each data chunk; using the chunk's entropy value to determine whether the compress the chunk; determining whether the chunk is compressible (e.g., in accordance with the chunk's entropy value or, if compression performed, actual amount of data reduction achieved with the resulting compressed form of the chunk); and updating Nc and Nu based on compressibility of data chunks in the initial portion. From step 604, control proceeds to step 606 where current values for the metrics Nc, Nu, Te and Tc for the data set are obtained. As described herein, Nc and Nu may have initial values based on data collected in connection with step 604 processing. Additionally, values for Tc and Te may be obtained and may be constant values or dynamic values determined based on the data collected in step 604.

From step 606, control proceeds to step 608 where the inequality, such as in EQUATION 3D, is evaluated for the data set using the metrics of the data set from step 606. From step 608, control proceeds to step 610. At step 610 an activate or deactivate status is determined for the data set based on the evaluation of the inequality of the data set performed in step 608. In particular, consistent with discussion herein, if the inequality is true, then entropy computation is activated for the data set. If the inequality is false, then entropy computation is deactivated for the data set. From step 610, control proceeds to step 702 where a determination is made as to whether entropy computation is activated. If step 702 evaluates to no, control proceeds to step 704. At step 704, a next portion of data chunks of the data set are processed whereby entropy computation is omitted for such chunks. Such processing may include compressing each chunk, determining whether each chunk is compressible (e.g., in accordance with the actual amount of data reduction achieved with the resulting compressed form of the chunk), and updating Nc and Nu based on compressibility of the data chunks in the next portion just processed. Additionally in step 704, Tc may be updated as needed based on the particular chunks compressed, if Tc is maintained as a dynamic value for the data set. From step 704, control proceeds to step 606.

If step 702 evaluates to yes, control proceeds to step 706. At step 706, a next portion of data chunks of the data set are processed whereby entropy computation is performed for such chunks. Such processing may include computing an entropy value for each chunk; using each chunk's entropy value to determine whether to compress the chunk; determining whether the chunk is compressible (e.g., in accordance with the chunk's entropy value or, if compression is performed, actual amount of data reduction achieved with the resulting compressed form of the chunk); and updating Nc and Nu based on compressibility of data chunks in the next portion just processed. Additionally in step 706, Te and Tc may be updated as needed based on the particular chunks processed if Te and Tc are maintained as dynamic values for the data set. From step 706, control proceeds to step 606.

Consistent with other discussion herein, it should be noted that the processing of flowcharts of FIGS. 6 and 7 may be performed as part of inline processing, such as ILC, or may alternatively be performed in connection with a data set offline, such as with respect to a data set after the chunks have been written to the data set. For example, at least steps 514, 516, 518 and 510 of FIG. 5 may be performed as part of ILC processing for a received data chunk (e.g., inline as part of the I/O or data path). In at least one embodiment, a status setting for the data set may be maintained denoting whether to perform entropy computation as part of ILC processing for chunks of the data set. In at least one embodiment, the evaluation of the inequality (e.g., step 504 of FIG. 5) and whether to active/deactivate entropy computation for a data set (e.g., steps 506, 508 and 512) may be performed periodically, independent of when a particular chunk is received for ILC processing, and used to determine a current value of the status setting. As a variation, rather than maintain the foregoing status setting for a data set, an embodiment may dynamically evaluate the inequality as part of ILC processing for chunks of the data set.

The techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

While the invention has been disclosed in connection with embodiments shown and described in detail, their modifications and improvements thereon will become readily apparent to those skilled in the art. Accordingly, the spirit and scope of the present invention should be limited only by the following claims.

What is claimed is:

1. A method of data processing comprising:
   receiving, using a processor, a data chunk of the data set;
   determining, using a processor and in accordance with criteria including a compressibility ratio for the data set and a cost ratio of a compression computation cost and an entropy computation cost, whether to activate or deactivate entropy computation for the data set, wherein the compressibility ratio is a ratio of a number of compressible data chunks of the data set and a number of uncompressible data chunks of the data set;
   responsive to determining to activate entropy computation for the data set, setting an entropy computation status for the data set to an activated status using a processor, and otherwise setting the entropy computation status for the data set to a deactivated status using a processor;
   responsive to the entropy computation status for the data set having the activated status, performing first processing of the data chunk using a processor, said first processing comprising:
      determining an entropy value for the data chunk; and
      determining, in accordance with the entropy value for the data chunk, whether to compress the data chunk; and
   responsive to the entropy computation status for the data set having the deactivated status, performing second processing of the data chunk using a processor, wherein said second processing omits determining a corresponding entropy value for the data chunk and wherein said second processing includes:
      compressing the data chunk; and
      generating, as an output of said compressing the data chunk, a compressed form of the data chunk.

2. The method of claim 1, wherein the second processing further comprises:
   determining whether the compressed form of the data chunk, as compared to an original uncompressed form of the data chunk, achieves at least a threshold level of data reduction;

responsive to determining the compressed form of the data chunk achieves at least a threshold level of data reduction, determining the data chunk is compressible and storing the data chunk in the compressed form; and responsive to determining the compressed form of the data chunk does not achieve at least a threshold level of data reduction, determining the data chunk is uncompressible and storing the data chunk in its uncompressed form.

3. The method of claim 2, further comprising:

responsive to determining the data chunk is compressible, incrementing a counter, Nc, denoting the number of compressible chunks of the data set; and responsive to determining the data chunk is uncompressible, incrementing a counter, Nu, denoting the number of uncompressible chunks of the data set.

4. The method of claim 3, wherein the compressibility ratio for the data set is dynamically determined at a point in time as a ratio of Nc to Nu.

5. The method of claim 3, wherein the criteria includes an inequality that, when evaluated to true, activates entropy computation for the data set and otherwise deactivates entropy computation for the data set.

6. The method of claim 5, wherein the inequality is expressed as:

$Nc/Nu<(\text{the cost ratio}-1)$.

7. The method of claim 1, wherein the first processing further comprises:

determining whether the entropy value for the data chunk is greater than an entropy threshold;

responsive to determining that the entropy value for the data chunk is greater than the entropy threshold, determining that the data chunk is uncompressible and not to compress the data chunk; and responsive to determining that the entropy value for the data chunk is equal to or less than the entropy threshold, compressing the data chunk.

8. The method of claim 7, wherein compressing the data chunk performed as part of the first processing includes:

determining whether a compressed form of the data chunk, as compared to an original uncompressed form of the data chunk, achieves at least a threshold level of data reduction;

responsive to determining the compressed form of the data chunk achieves at least a threshold level of data reduction, determining the data chunk is compressible and storing the data chunk in the compressed form; and responsive to determining the compressed form of the data chunk does not achieve at least a threshold level of data reduction, determining the data chunk is uncompressible and storing the data chunk in its uncompressed form.

9. The method of claim 8, further comprising:

responsive to determining the data chunk is compressible, incrementing a counter, Nc, denoting the number of compressible chunks of the data set; and responsive to determining the data chunk is uncompressible, incrementing a counter, Nu, denoting the number of uncompressible chunks of the data set.

10. The method of claim 9, wherein the compressibility ratio for the data set is dynamically determined at a point in time as a ratio of Nc to Nu.

11. The method of claim 10, wherein the criteria includes an inequality that, when evaluated to true, activates entropy computation for the data set and otherwise deactivates entropy computation for the data set.

12. The method of claim 11, wherein the inequality is expressed as:

$Nc/Nu<(\text{the cost ratio}-1)$.

13. The method of claim 1, wherein the data set includes any one or more of: a database, one or more selected portions of a database, selected data portions used by a particular application, selected data portions stored on one or more logical devices, one or more files, one or more directories, one or more file systems, selected portions of one or more directories, and selected portions of one or more file systems.

14. The method of claim 1, wherein the first processing and the second processing are performed inline as part of I/O path processing for the data chunk.

15. A system comprising:

a processor; and a memory comprising code stored thereon that, when executed, performs a method of data processing comprising:

receiving a data chunk of the data set;

determining, in accordance with criteria including a compressibility ratio for the data set and a cost ratio of a compression computation cost and an entropy computation cost, whether to activate or deactivate entropy computation for the data set, wherein the compressibility ratio is a ratio of a number of compressible data chunks of the data set and a number of uncompressible data chunks of the data set;

responsive to determining to activate entropy computation for the data set, setting an entropy computation status for the data set to an activated status, and otherwise setting the entropy computation status for the data set to a deactivated status;

responsive to the entropy computation status for the data set having the activated status, performing first processing of the data chunk, said first processing comprising:

determining an entropy value for the data chunk; and determining, in accordance with the entropy value for the data chunk, whether to compress the data chunk; and responsive to the entropy computation status for the data set having the deactivated status, performing second processing of the data chunk, wherein said second processing omits determining a corresponding entropy value for the data chunk and wherein said second processing includes:

compressing the data chunk; and generating, as an output of said compressing the data chunk, a compressed form of the data chunk.

16. A non-transitory computer readable medium comprising code stored thereon that, when executed, performs a method of data processing comprising:

receiving a data chunk of the data set;

determining, in accordance with criteria including a compressibility ratio for the data set and a cost ratio of a compression computation cost and an entropy computation cost, whether to activate or deactivate entropy computation for the data set, wherein the compressibility ratio is a ratio of a number of compressible data chunks of the data set and a number of uncompressible data chunks of the data set;

responsive to determining to activate entropy computation for the data set, setting an entropy computation status for the data set to an activated status, and otherwise setting the entropy computation status for the data set to a deactivated status;

responsive to the entropy computation status for the data set having the activated status, performing first processing of the data chunk, said first processing comprising:

determining an entropy value for the data chunk; and determining, in accordance with the entropy value for the data chunk, whether to compress the data chunk; and responsive to the entropy computation status for the data set having the deactivated status, performing second processing of the data chunk, wherein said second processing omits determining a corresponding entropy value for the data chunk and wherein said second processing includes:

compressing the data chunk; and generating, as an output of said compressing the data chunk, a compressed form of the data chunk.

17. The non-transitory computer readable medium of claim 16, wherein the second processing further comprises:

determining whether the compressed form of the data chunk, as compared to an original uncompressed form of the data chunk, achieves at least a threshold level of data reduction;

responsive to determining the compressed form of the data chunk achieves at least a threshold level of data reduction, determining the data chunk is compressible and storing the data chunk in the compressed form; and responsive to determining the compressed form of the data chunk does not achieve at least a threshold level of data reduction, determining the data chunk is uncompressible and storing the data chunk in its uncompressed form.

18. The non-transitory computer readable medium of claim 17, wherein the method further comprises:

responsive to determining the data chunk is compressible, incrementing a counter, Nc, denoting the number of compressible chunks of the data set; and responsive to determining the data chunk is uncompressible, incrementing a counter, Nu, denoting the number of uncompressible chunks of the data set.

\* \* \* \* \*